(12) United States Patent
Shimazu et al.

(10) Patent No.: US 6,686,274 B1
(45) Date of Patent: Feb. 3, 2004

(54) SEMICONDUCTOR DEVICE HAVING COBALT SILICIDE FILM IN WHICH DIFFUSION OF COBALT ATOMS IS INHIBITED AND ITS PRODUCTION PROCESS

(75) Inventors: Hiromi Shimazu, Tsuchiura (JP); Tomio Iwasaki, Tsuchiura (JP); Hiroyuki Ohta, Tsuchiura (JP); Hideo Miura, Tsuchiura (JP); Shuji Ikeda, Kodaira (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 09/787,743

(22) PCT Filed: Sep. 20, 1999

(86) PCT No.: PCT/JP99/05108

§ 371 (c)(1),
(2), (4) Date: Jun. 8, 2001

(87) PCT Pub. No.: WO00/17939

PCT Pub. Date: Mar. 30, 2000

(30) Foreign Application Priority Data

Sep. 22, 1998 (JP) .......................................... 10/267695

(51) Int. Cl.[7] .............................................. H01L 21/44
(52) U.S. Cl. ..................................... 438/653; 438/655
(58) Field of Search .......................... 438/653; 757/766, 757/757, 755, 758, 769

(56) References Cited

U.S. PATENT DOCUMENTS 5,897,348 A * 4/1999 Wu ............................. 438/200
6,294,420 B1 * 9/2001 Tsu et al. .................... 438/239

FOREIGN PATENT DOCUMENTS

DE 286062 A * 1/1991 ........... H01L/21/20

OTHER PUBLICATIONS

Mo et al., "Formation and Properties of ternary silicide (CoNi)Si2 thin films", IEEE, 1998 5th International Conference on Solid State and Integrated Circuit Technology, pp 271–274.*
Hong et al., Magneto–optic Kerr effect measurements on FeCoSi epitaxially stabilized on Si (111), Journal of Magetism and Magnetic Materials, vol. 165, pp 212–215.*
http://www.puretechinc.com and http://www.tosohsmd-.com/tsprod/tspcobdt.htm, Material Data Sheet MDS 27.000 which includes the total metallics of the cobalt target., pp. 1–4 and pp. 1–3.*
Safety & Health Guide for the Microelectronics Industry, "Hazard Communication", OSHA 3107, pp 9, 1998.*

* cited by examiner

*Primary Examiner*—W. David Coleman
(74) *Attorney, Agent, or Firm*—Antonelli, Terry, Stout & Kraus, LLP

(57) ABSTRACT

In a semiconductor device having a cobalt silicide film, at least nickel or iron is contained in the cobalt silicide film for preventing the rise of resistance incidental to thinning of the film.

13 Claims, 8 Drawing Sheets

SEMICONDUCTOR DEVICE HAVING COBALT SILICIDE FILM IN WHICH DIFFUSION OF COBALT ATOMS IS INHIBITED AND ITS PRODUCTION PROCESS

TECHNICAL FIELD

The present invention relates to a semiconductor device and its production process, particularly to a semiconductor device having a cobalt silicide film and its production process.

BACKGROUND ART

With the recent trend toward higher integration and miniaturization of the semiconductor devices, reduction of contact resistance at the joint of metal wiring and silicon substrate has become essential for high-speed operation. Regarding the techniques for reducing contact resistance, for instance JP-A-08-78357 suggests to form a cobalt silicide film on the diffusion layer (source/drain) or polycrystalline silicon electrodes on a silicon substrate.

DISCLOSURE OF THE INVENTION

However, when the diffusion layer is made shallow and the cobalt silicide film is thinned with miniaturization of the semiconductor devices, there arises the new problem that the cobalt silicide coating, which was film-like when formed, is coagulated by a high-temperature heat treatment in, for instance, the capacitor forming step and takes a partially insular configuration, causing a rise of resistance.

The object of the present invention is to solve the above problem and provide a semiconductor device having a cobalt silicide film which is proof against coagulation and remains low in resistance even if reduced in thickness, and a process for producing such a semiconductor device.

Rise of resistance of the cobalt silicide film is attributable to the insular coagulation of the cobalt silicide which occurs when the cobalt (Co) atoms composing the cobalt silicide film are diffused mostly along the crystal grain boundaries and recombined with silicon in a heat treatment at around 800° C. or above. Therefore, for preventing the rise of resistance due to the coagulation of cobalt silicide film, it is expedient to inhibit the diffusion of cobalt atoms in the cobalt silicide film.

On this concept, the present inventors disclosed that it is possible to inhibit the grain boundary diffusion of Co atoms in the cobalt silicide film when a specific element—an element having a smaller atomic radius than Co atom and specified by the fact that the inter-hetero-atomic energy between this element and Co element is not more than 20% smaller or greater than the inter-iso-atomic energy of Co element—is contained in said cobalt silicide film. That is, it was found the diffusion of Co atoms can be inhibited by containing nickel or iron element in the cobalt silicide film, and that in this case, the ratio of nickel or iron element to cobalt in said film should be preferably 0.05 to 50 atomic %, more preferably 0.05 to 18 atomic %.

It was also found that the use of multi-stage sputtering or an alloy target is suited for forming the said cobalt silicide film.

BEST MODE FOR CARRYING OUT THE INVENTION

Hereinafter, the present invention will be described regarding its embodiments with reference to the accompanying drawings.

Figure 1:
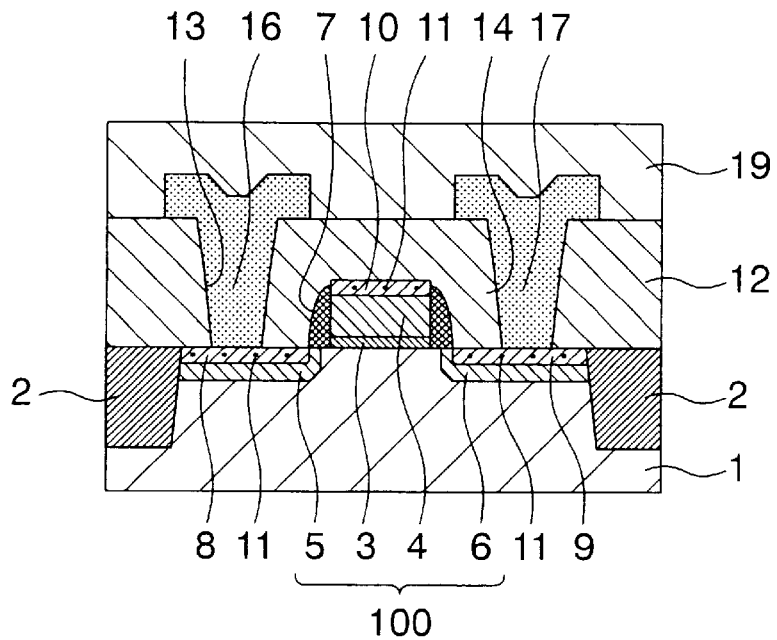
FIG. 1 is a sectional view of a principal part of a semiconductor device in a first embodiment of the present invention.

First, a sectional structure of a principal part of a semiconductor device in a first embodiment of the present invention is shown in FIG. 1.

The semiconductor device according to this embodiment of the invention, as shown in FIG. 1, has MOS transistors 100 formed on the surface of a silicon substrate, each of said MOS transistors comprising a gate oxide film 3, a gate electrode 4 made of a polycrystalline silicon film, and a pair of diffusion layers 5, 6 (source and drain region). These MOS transistors are isolated by the isolating films 2. Said gate electrode 4 is made of a polycrystalline silicon film, a thin metal film, a metal silicide film or a laminate thereof. Side walls 7 are formed on both sides of said gate electrode 4. The gate oxide film 3 is made of, for instance, a silicon oxide,film, a silicon nitride film, a ferroelectric film or a laminate thereof.

Cobalt silicide films 8, 9, 10 are formed on the gate electrode 4 and the diffusion layers 5, 6. Said cobalt silicide films 8, 9, 10 contain at least one adding element, and at least one of such adding elements is nickel (Ni) or iron (Fe).

The Ni or Fe atoms in said cobalt silicide films 8, 9, 10 may exist either in the form of nickel or iron silicide or as a single body of Ni or Fe.

The gate electrode 4 and diffusion layers 5, 6 on which said cobalt silicide films 8, 9, 10 are formed, and the electrical wirings 16, 17 of the first layer are electrically connected in the contact holes 13, 14 formed in an insulating film 12 of the first layer. Further, over the top of said first layer windings 16, 17 is provided an insulating film 19 for electrically insulating the unit from the outside. Said insulating film 19 may be made of, for instance, a BPSG (boron-doped phosphosilicate glass) film, a SOG (spin-on-glass) film or a silicon oxide or nitride film formed by CVD or sputtering.

Next, the action and effect of the semiconductor device according to the instant embodiment of the invention is described. The conventional cobalt silicide film would be elevated in resistance by a heat treatment of about 700° C. or higher after formation of the film. This is attributable to the coagulation of cobalt silicide which occurs as the Co atoms composing the cobalt silicide film are diffused along the crystal grain boundaries of cobalt silicide and move toward the chemically more stable Si atoms to recombine with them when the film is heat treated at around 700° C. or above in a step after formation of the film. Therefore, inhibition of the grain boundary diffusion of Co atoms is a positive way for preventing elevation of resistance due to agglomeration of the cobalt silicide film.

Iron has the advantage of allowing reduction of stress of the silicide film with ease, while nickel is advantageous in that it has the effect of making the film hard to oxide.

The present inventors found that it is possible to inhibit the grain boundary diffusion of Co atoms in the cobalt silicide film by containing a specific adding element in the film.

Figure 2:
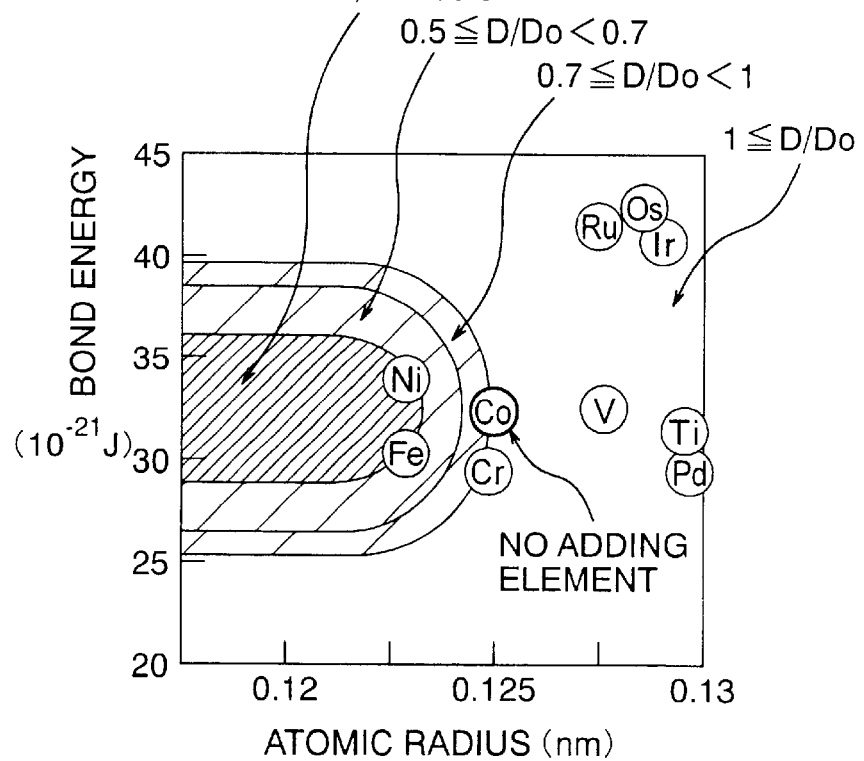
FIG. 2 is a diagrammatic illustration of the effect of inhibiting the grain boundary diffusion of cobalt atoms in a cobalt silicide film by containing an adding element in said film.

FIG. 2 shows the effect of inhibiting the grain boundary diffusion of cobalt atoms in a cobalt silicide film by containing an adding element in the film. Such inhibitory effect of the adding element is represented by the rate of decrease of grain boundary diffusion coefficient.

In FIG. 2, the grain boundary diffusion coefficient D of Co atoms in a cobalt silicide film was calculated by calculator simulation, and the effect of the adding element is shown diagrammatically by focusing attention on the atomic radius and bond energy of the adding element. In this embodiment, each adding element was contained in an amount of 0.2 atomic %, and $D_0$ denotes the grain boundary diffusion coefficient when no adding element was contained. Calculator simulation used here is molecular dynamic simulation. Molecular dynamic simulation is a method in which, as for instance explained in Journal of Applied Physics, Vol. 53 (1983), pages 4864–4878, the force working between the atoms through interatomic potential is calculated, and based on this force, the Newton's equation of motion is solved to determine the position of each atom at each time. The method of calculating the diffusion coefficient by molecular dynamic simulation is shown in, for instance, Physical Review B, Vol. 29 (1984), pages 5363–5371. Here, the effect of the adding elements was described by taking up the case where the diffusion coefficient of Co atoms at the crystal grain boundaries was calculated by setting the temperature at 1,000 K. This effect can be explained in the same way even when the simulation conditions are changed.

It was found from FIG. 2 that it is possible to minimize the grain boundary diffusion coefficient D when the adding element has a smaller atomic radius than the Co atoms composing the cobalt silicide film and the inter-hetero-atomic bond energy between said adding element and Co atoms is close to the inter-iso-atomic atomic bonde energy of the Co atoms.

Also, in case no adding element is contained in the region where the difference between said inter-hetero-atomic bond energy and inter-iso-atomic bond energy is less than about 20%, the ratio of D to $D_0$ sharply decreases from 1 to 0.7 and the effect of inhibiting the grain boundary diffusion becomes conspicuous.

It was disclosed that nickel or iron element satisfies these conditions and functions to inhibit the grain boundary diffusion of Co atoms in the cobalt silicide film.

Figure 16:
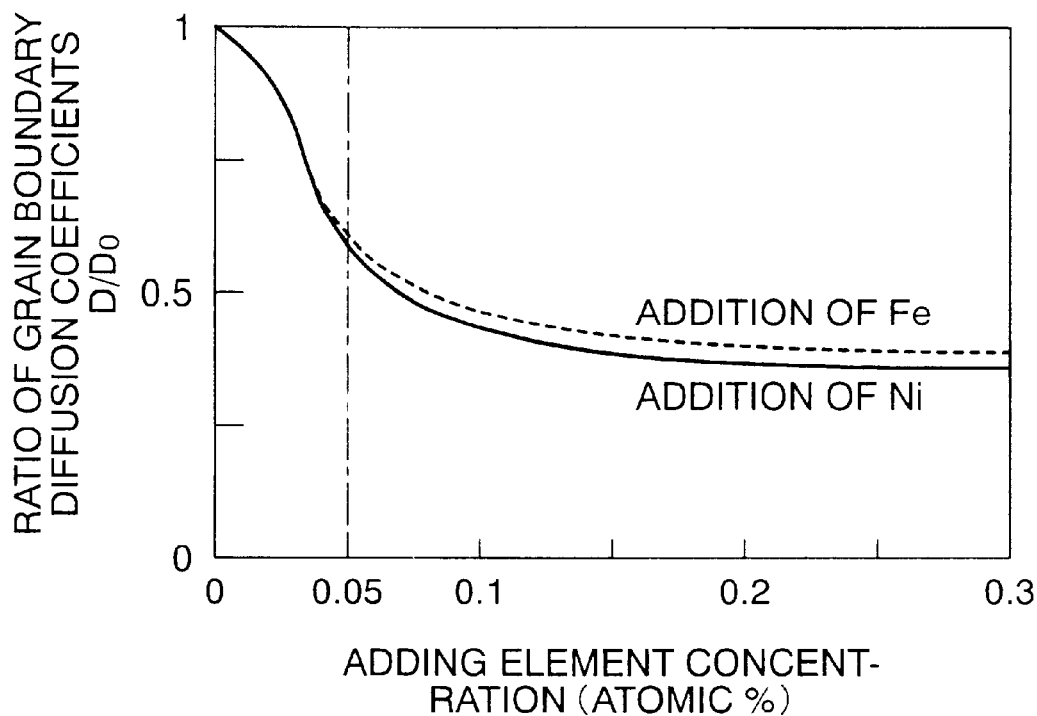
FIG. 16 is a graph showing the influence of the adding element concentration on the grain boundary diffusion coefficient when an adding element was added in an amount of 0 to 0.3 atomic % in a cobalt silicide film.

Referring to FIG. 16, it shows the influence of the adding element concentration on grain boundary diffusion when nickel or iron element is added 0 to 0.3 atomic % in the cobalt silicide film. It is seen from FIG. 16 that when the adding element concentration is about 0.05 atomic % or more based on Co in the cobalt silicide film, the grain boundary diffusion coefficient decreases sharply to inhibit diffusion. On the other hand, when the adding element is added 50% or more, cobalt silicide becomes no longer able to exist as such. Therefore, the ratio of the adding element to Co in the cobalt silicide film is preferably 0.05 to 50 atomic %.

Figure 17:
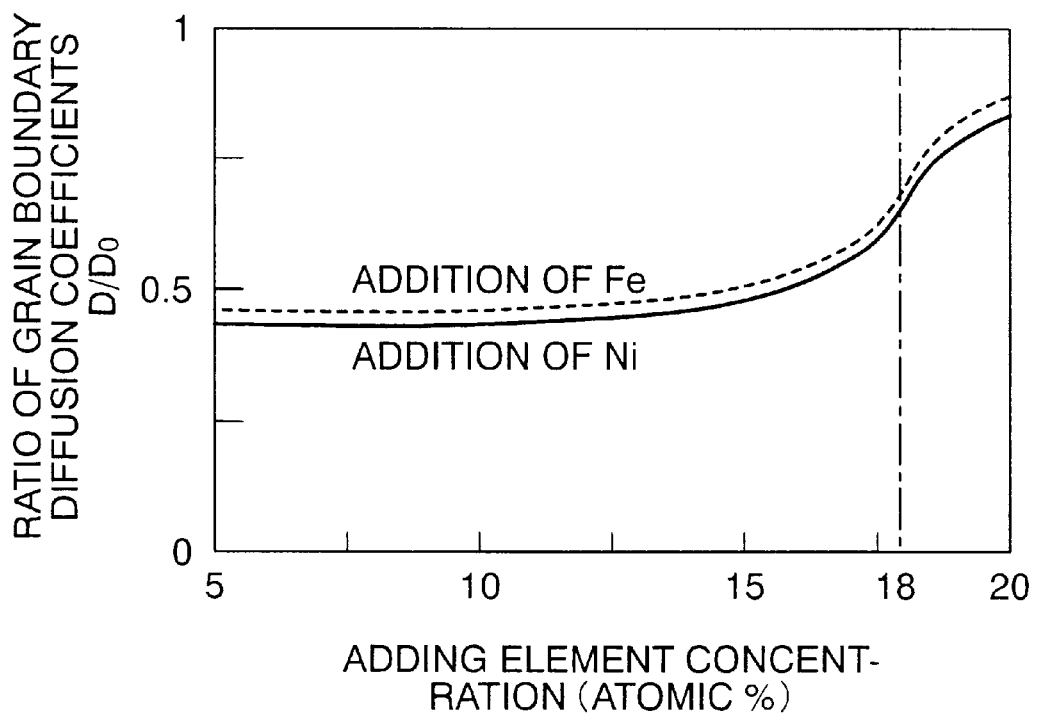
FIG. 17 is a graph showing the influence of the adding element concentration on the grain boundary diffusion coefficient when the adding element was added in an amount of 5 to 20 atomic % in the cobalt silicide film.

FIG. 17 shows the influence of the adding element concentration on the grain boundary diffusion coefficient when nickel or iron element is added 5 to 20 atomic % in the cobalt silicide film. As is seen from FIG. 17, when the adding element concentration becomes about 18 atomic % or more based on Co in the cobalt silicide film, the grain boundary diffusion coefficient increases to reduce the diffusion inhibitory effect. This is because the crystal structure of cobalt silicide is deranged when the ratio of the adding element becomes about 18 atomic % or more. Thus, the ratio of the adding element to Co in the cobalt silicide film is preferably 0.05 to 18 atomic %.

Figure 3:
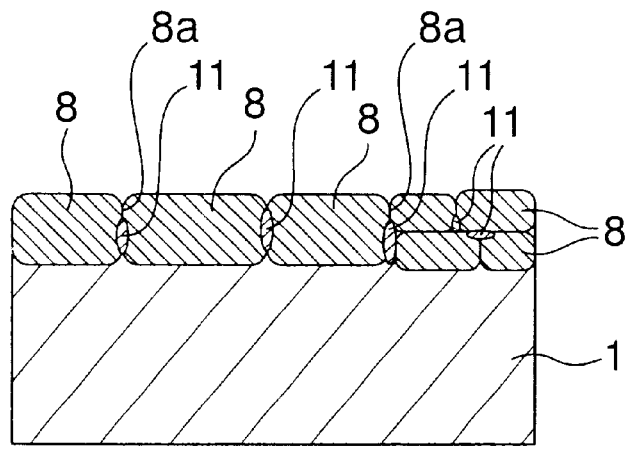
FIG. 3 is a sectional view showing the state of segregation of Ni at the crystal grain boundaries in an Ni-containing cobalt silicide film.

For inhibiting the grain boundary diffusion, the adding element, i.e. Ni or Fe atoms, may exist either in the form of silicide or as a single body of Ni or Fe, but as shown in FIG. 3, the greatest effect can be obtained when such an adding element 11 is segregated at the crystal grain boundaries 8a in the cobalt silicide film 8.

As explained above, when a specific element—an element which has a smaller atomic radius than the Co atoms composing the cobalt silicide film and which meets the condition that the inter-atomic energy between this element and Co element is not smaller or greater than the inter-atomic energy of Co element by more than 20%—that is, nickel or iron element, is contained in the cobalt silicide film, it is possible to inhibit the grain boundary diffusion of Co in the cobalt silicide film, allowing inhibition of coagulation of cobalt silicide to thereby prevent the rise of resistance of said film.

In this embodiment of the invention, a cobalt silicide film is formed on all of the gate electrode 4 and diffusion layers 5, 6, but said film may be formed on the gate electrode or the diffusion layers alone. Also, the diffusion layers 5, 6 may be of a LDD structure. In either of these cases, the same effect can be obtained.

The semiconductor device in this embodiment of the invention is not restricted to the above-described construction, and the number of the wiring layers is also not limited to one. Further, this semiconductor device can be used for DRAM (dynamic random access memory), SRAM (static random access memory), microcomputers, LSI systems and such.

Figure 4:
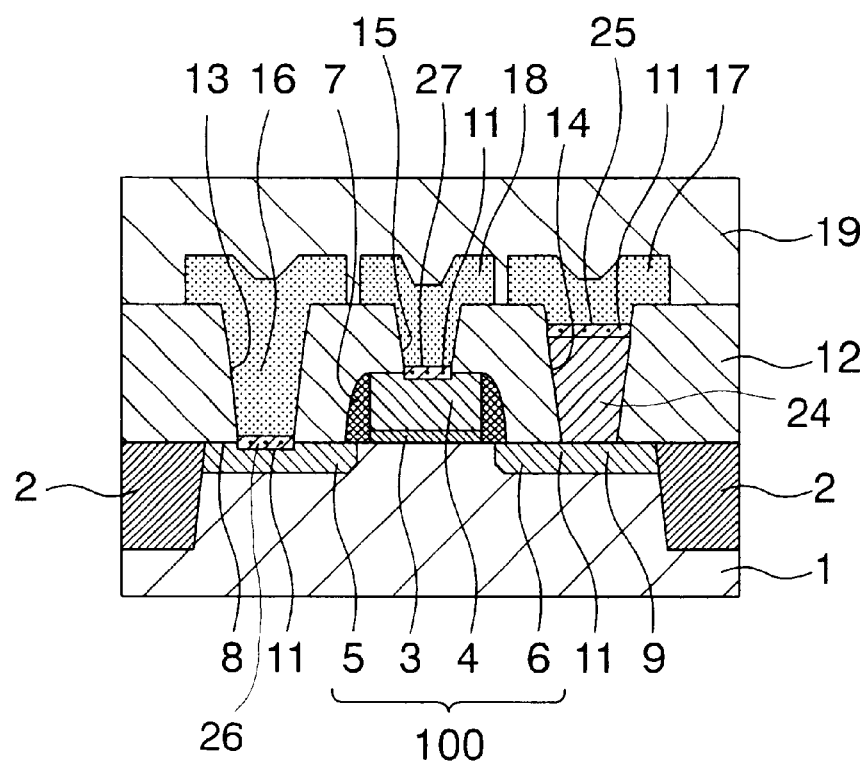
FIG. 4 is a sectional view of a principal part of a semiconductor device in a second embodiment of the present invention.

FIG. 4 shows a sectional structure of a principal part of a semiconductor device in the second embodiment of the present invention. In this figure, the parts corresponding to those in the first embodiment are affixed the same reference numerals.

The semiconductor device according to the instant embodiment of the present invention, as shown in FIG. 4, has MOS transistors 100 formed on the surface of a silicon substrate 1, each of said MOS transistors comprising a gate oxide film 3, a gate electrode 4 made of a polycrystalline silicone film, and a pair of diffusion layers 5, 6 (source and drain region). The respective MOS transistors are isolated by an isolation film 2. Said gate electrode 4 is made of a polycrystalline silicon film, a thin metal film, a metal silicide film or a laminate thereof. Side walls 7 are formed on both sides of said gate electrode 4. The gate oxide film 3 comprises, for instance, a silicone oxide film, a silicon nitride film, a ferroelectric film or a laminate thereof.

An insulating film 12 of the first layer is provided on the silicon substrate having said MOS transistors formed thereon, and a cobalt silicide film 26 is formed at the interface between the first layer electric wiring 16 and diffusion layer 5 in a contact hole 13 formed in said first layer insulating film 12. Also, a polycrystalline silicon plug 24 is embedded in another contact hole formed in said first layer insulating film 12, and a cobalt silicide film 25 is formed at the interface between the first layer electric wiring 17 and said polycrystalline silicon plug 24. Further, a cobalt silicide film 17 is formed at the interface between said first layer electric wiring 17 and said gate electrode 4 in still another contact hole 15 formed in said first layer insulating film 12.

Said cobalt silicide films 25, 26, 27 contain at least one adding element 11, and at least one of such adding elements is nickel (Ni) or iron (Fe). The Ni or Fe atoms in these cobalt silicide films may exist either in the form of nickel or iron silicide or as a single body of Ni or Fe.

Over the said first layer wirings 16, 17, 18 is provided an insulating film 19 for electrically insulating the unit from the outside. This insulating film 19 comprises, for instance, a BPSG (boron-doped phosphosilicate glass) film, SOG (spin-on-glass) film or a silicon oxide or nitride film formed by CVD or sputtering.

Thus, when an element which has a smaller atomic radius than the Co or Si atoms and which is of such characteristics that the inter-atomic energy between this element and Co atoms is not smaller or greater than the inter-atomic energy of Co element by more than 20%, that is, nickel or iron element, is contained in the cobalt silicide film, it is possible to inhibit the grain boundary diffusion of Co in the cobalt silicide film, thereby inhibiting coagulation of cobalt silicide to prevent increase of resistance of said film.

In this embodiment of the invention, the cobalt silicide films 25, 26, 27 containing nickel or iron as the adding element 11 are formed on all of the diffusion layer 5, polycrystalline plug 24 and gate electrode 4, but the cobalt silicide film may be formed on only one of them. In this case, too, the same effect can be obtained.

The semiconductor device in this embodiment of the invention is not restricted to the above-described construction, and the number of the diffusion layers is not limited to one. Also, this semiconductor device may be used for DRAM (dynamic random access memory), SRAM (static random access memory), microcomputers, LSI systems, etc.

Next, the third embodiment of the present invention is described with reference to FIG. 5.

Figure 5:
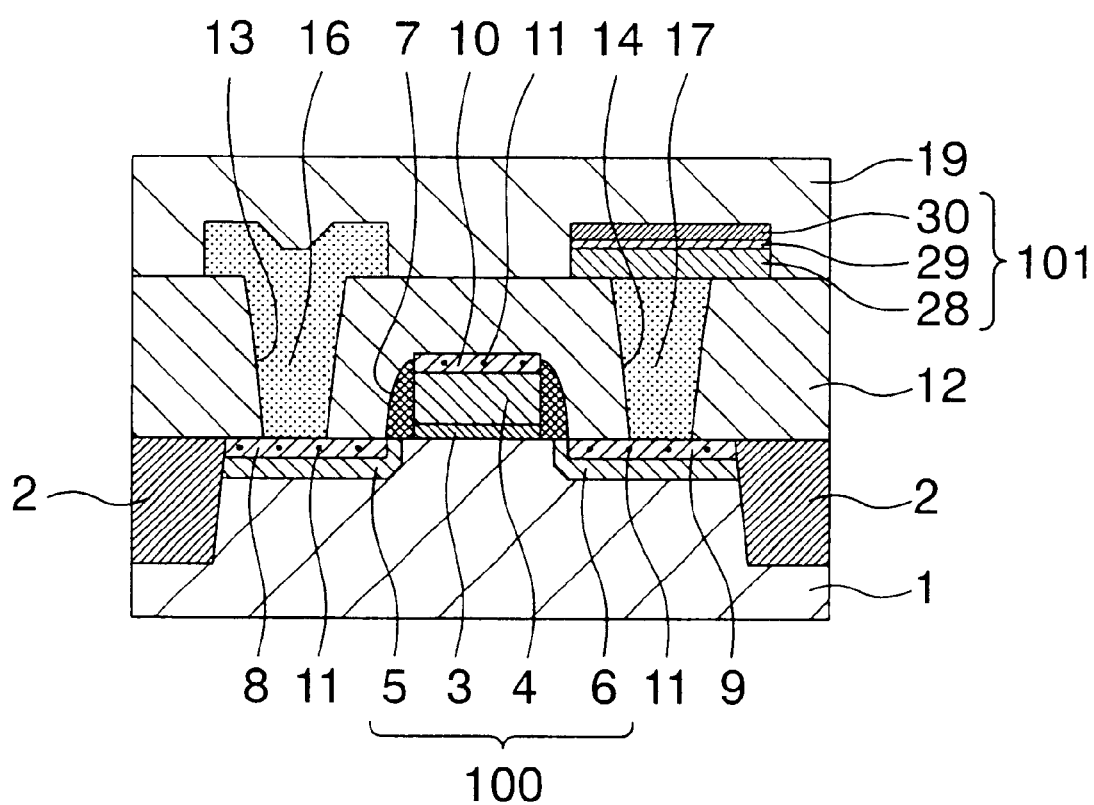
FIG. 5 is a sectional view of a principal part of a semiconductor device in a third embodiment of the present invention.

FIG. 5 shows a sectional structure of a principal part of a semiconductor device according to this embodiment of the invention, in which the parts corresponding to those in the first embodiments are affixed the same reference numerals.

The semiconductor device according to this embodiment shown in FIG. 5 is a modification of the semiconductor device according to the first embodiment shown in FIG. 1. The difference of this embodiment from the first embodiment is that in this embodiment a capacitor 101 comprising a laminate of a lower electrode 28, a dielectric film 29 and an upper electrode 30 is provided on the insulating film 12 of the first layer.

The dielectric film 29 constituting part of the capacitor is made of, for instance, a silicon oxide film, a tantalum oxide film, a BST (barium strontium titanate) film, a PZT (zinc zirconate titanate) film or the like. The lower electrode 29 or upper electrode 30 may be composed of, for instance, polycrystalline silicon, titanium nitride, tungsten, ruthenium, indium, platinum, ruthenium oxide, indium oxide or the like.

In the present embodiment of the invention, said cobalt silicide films 8, 9, 10 contain at least one adding element 11, and at least one of such adding elements 11 is nickel (Ni) or iron (Fe). The Ni or Fe atoms in these cobalt silicide films may exist either in the form of nickel or iron silicide or as a single body of Ni or Fe.

It is thereby possible to inhibit the grain boundary diffusion of Co in the cobalt silicide film, allowing inhibition of coagulation of this film to prevent the rise of resistance of the film.

Now, the fourth embodiment of the present invention is described with reference to FIG. 6.

Figure 6:
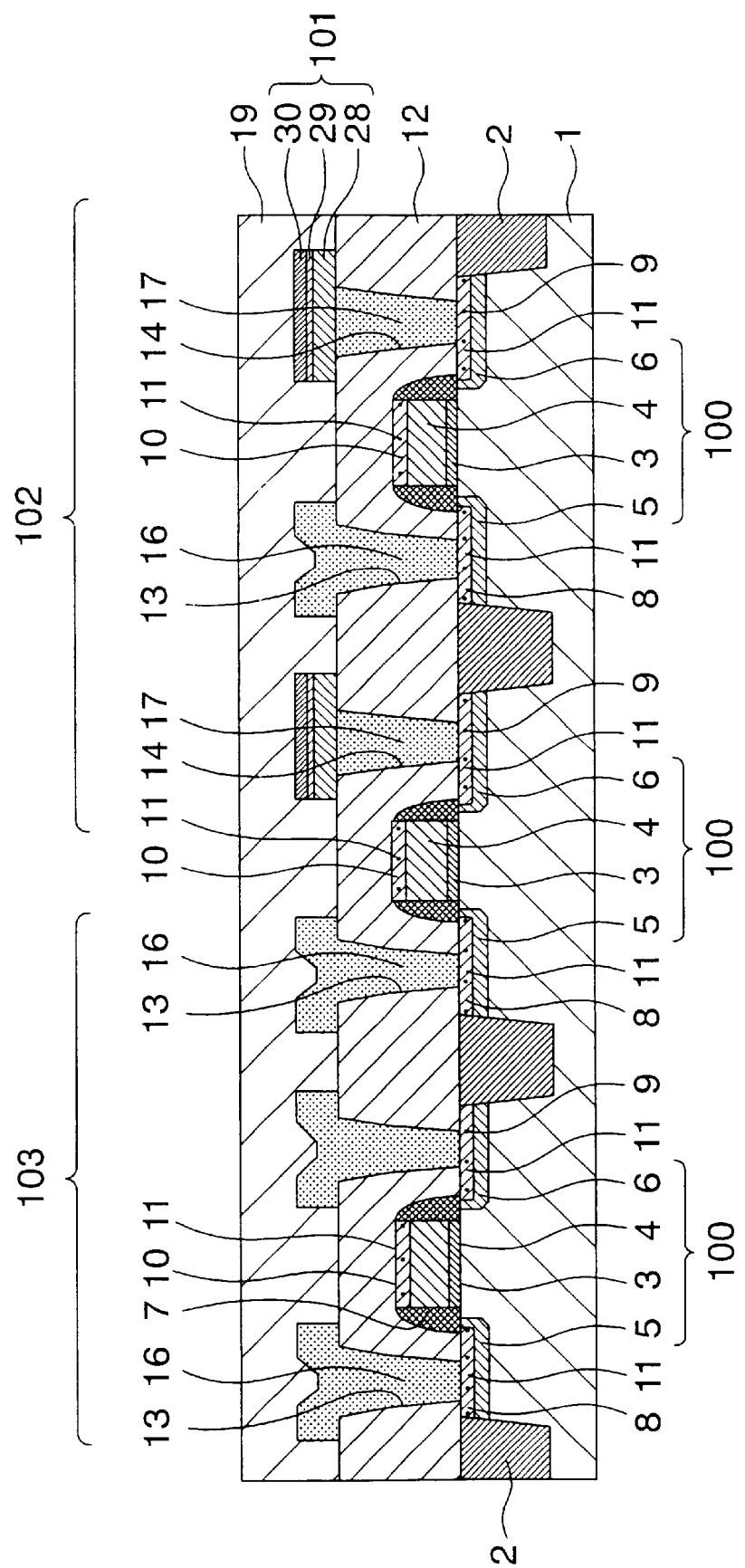
FIG. 6 is a sectional view of a principal part of a semiconductor device in a fourth embodiment of the present invention.

FIG. 6 is a sectional structure of a principal part of a semiconductor device according to the present embodiment, in which the parts corresponding to those in the first or third embodiment are affixed the same reference numerals.

The semiconductor device according to the present embodiment shown in FIG. 6 is a modification of the semiconductor device according to the first embodiment shown in FIG. 1 and that according to the third embodiment. In the present embodiment, the semiconductor device according to the first embodiment and that according to the third embodiment are provided on a same silicon substrate 1. That is, the semiconductor device according to the present embodiment is of a structure in which memory unit 102 and CPU unit 103 are formed on a silicon substrate 1.

In this embodiment, too, said cobalt silicide films 8, 9, 10 contain at least one adding element 11, and at least one of such adding elements is nickel (Ni) or iron (Fe). The Ni or Fe atoms in the cobalt silicide films may exist either in the form of nickel or iron silicide or as a single body of Ni or Fe.

It is thereby possible to inhibit grain boundary diffusion of Co in the cobalt silicide films, and accordingly coagulation is inhibited to prevent the rise of resistance of the cobalt silicide films.

In the present embodiment, a cobalt silicide film is formed on all of the gate electrodes 5 and diffusion layers 5,6 of both of the memory unit 102 and CPU unit 103, but said film may be formed on one of the memory unit 102 and CPU unit 103 or on the gate electrodes or diffusion layers alone. Also, the diffusion layers 5, 6 may of a LDD structure. In this case, too, the same effect as described above can be obtained.

Next, the process for producing a semiconductor device according to the fifth embodiment of the present invention is described with reference to FIGS. 7 to 10. An epitome of the production process in the present embodiment is described stepwise in accordance with the drawings.

Figure 7:
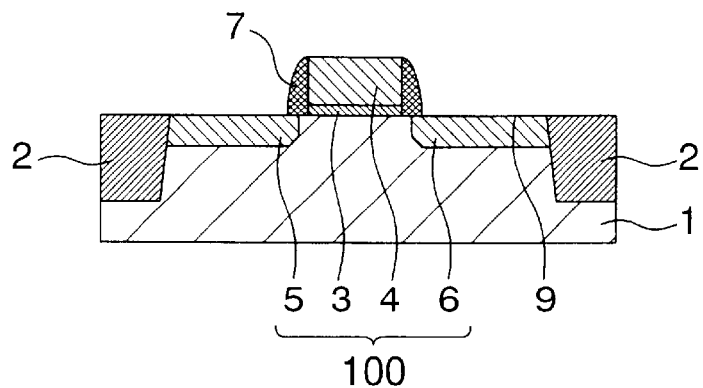
FIG. 7 is an illustration showing part of the production process of a semiconductor device in a fifth embodiment of the present invention.

FIG. 7: The principal surface of a silicon substrate 1 is sectioned into an active region and an isolation region by an isolation film 2. A gate oxide film 3 and a gate electrode 4 are formed in the active region of said silicon substrate 1. Then side walls 7 are formed on both sides of said gate electrode 4. Then, with said gate electrode 5, side walls 7 and isolation film 2 being masked, impurities are injected into said silicon substrate 1 to form diffusion layers 5, 6. This step is one which is commonly practiced in the production of ordinary MOS transistors, and has no direct bearing on the present invention. This step is not limited to the above-described procedure but any ordinary transistor forming step can be employed.

Figure 8:
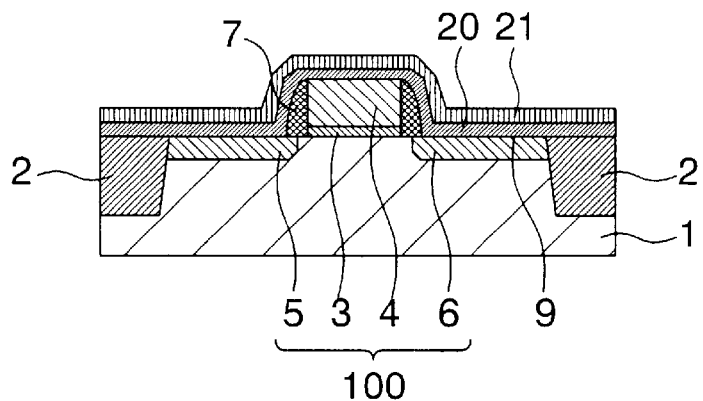
FIG. 8 is an illustration showing part of the production process of the semiconductor device in the fifth embodiment of the present invention.

FIG. 8: An Ni-containing cobalt film 20 is formed in contact with the upper side of at least said gate electrode 4 and diffusion layers 5, 6 on said silicon substrate by, for instance, sputtering. The Ni concentration in said Ni-containing cobalt film 20 is preferably 0.05 to 50 atomic %, more preferably 0.05 to 18 atomic %, based on Co. As for the method of forming said Ni-containing cobalt film 20, a film is formed while mixing Ni and Co by using a multi-stage sputtering device, or a film is formed by using a target in which Ni and Co have already been mixed. Forming the film while mixing Ni and Co by using a multi-stage sputtering device has the advantage that there is no need of forming a specific target. In case of forming the film by using a target in which Ni and Co have already been mixed, there is the advantage that it is easy to control the concentration of Ni relative to Co. Other methods than sputtering, such as vacuum deposition can be used for forming the film.

Then a titanium nitride film 21 is formed on said Ni-containing cobalt film 20. The film formed on the Ni-containing cobalt film 20 may not necessarily be a titanium nitride film; it may be other metal film or an insulating film, or such a film may not be formed at all.

Figure 9:
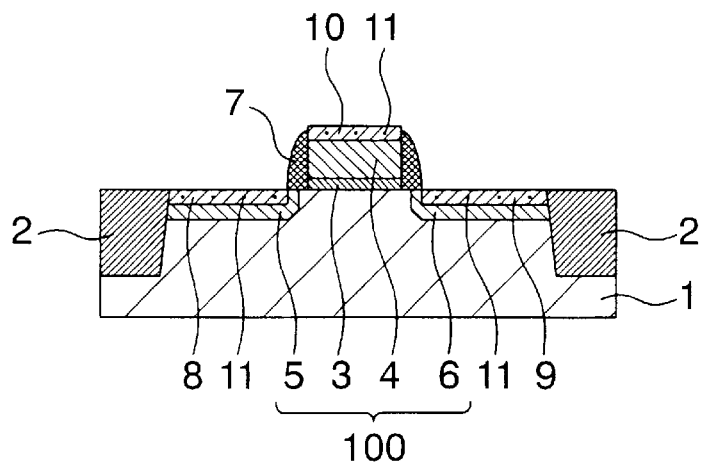
FIG. 9 is an illustration showing part of the production process of the semiconductor device in the fifth embodiment of the present invention.

FIG. 9: Thereafter, a treatment, for instance, a 700° C. heat treatment is carried out to cause a silicide reaction of the silicon of said gate electrode 4 and diffusion layers 5,6 with the cobalt film, thereby forming the cobalt silicide films 8, 9, 10 selectively on said gate electrode 4 and/or diffusion layers 5, 6. Here, Ni-containing cobalt silicide is formed by reacting silicon with the Ni-containing cobalt film. Since the grain boundary diffusion of Co atoms in the cobalt silicide film is inhibited, there takes place no coagulation in the ensuing step of high-temperature heat treatment, allowing formation of a low-resistance cobalt silicide.

Figure 15:
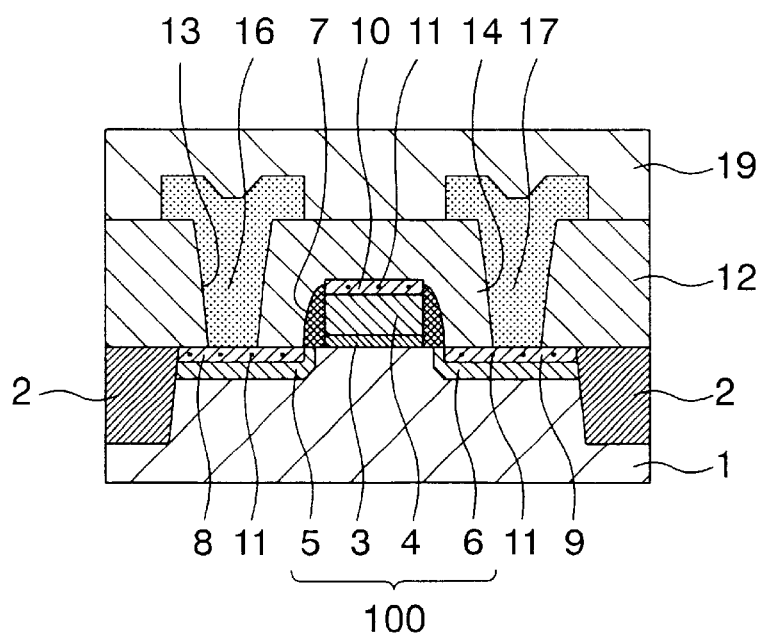
FIG. 15 is an illustration showing part of the production process of the semiconductor device in the sixth embodiment of the present invention.

According to this production process, the principal surface of the silicon substrate on which a cobalt silicide film is formed in contact constitutes an Si (111) plane, and the principal surface of cobalt silicide also forms a CoSi2 (111) plane as shown in FIG. 15. This is for the reason that, because of use of an Ni-containing cobalt film, the diffusion rate of Co atoms at the time of silicide reaction of nickel is lowered, allowing the silicon-cobalt reaction to take place slowly, so that cobalt silicide is formed in a most stable state.

Then, the said unreacted Ni-containing cobalt film 20 and titanium nitride film 21 on the isolation film 2 and side walls 7 are removed by wet etching or other means.

In the above-described embodiment, a cobalt silicide film is formed on both of the gate electrode a and the diffusion layers, but it may be formed on only one of them.

Also, the heat treatment for forming the cobalt silicide film may be carried out in two stages at about 500° C. and about 700° C., respectively. In this case, etching of the unreacted Ni-containing cobalt film and titanium nitride film may be conducted after 500° C. annealing.

Figure 10:
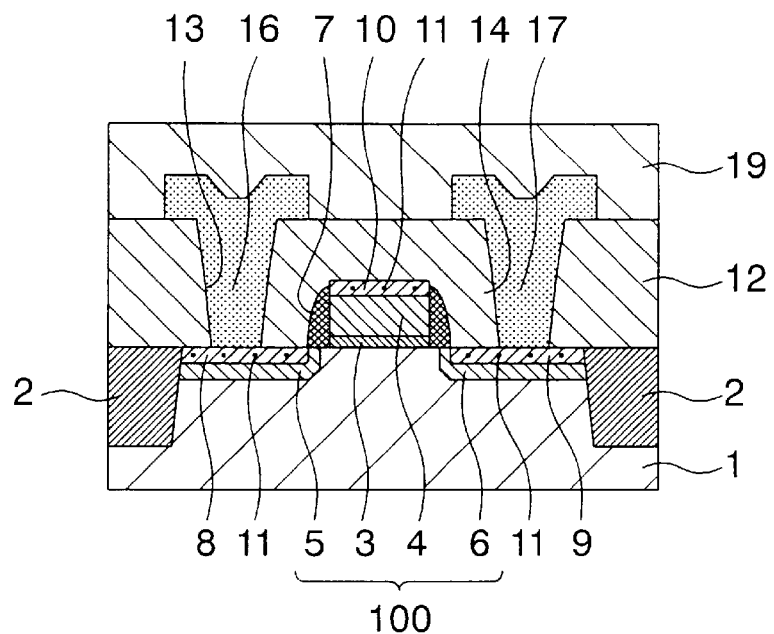
FIG. 10 is an illustration showing part of the production process of the semiconductor device in the fifth embodiment of the present invention.
Figure 11:
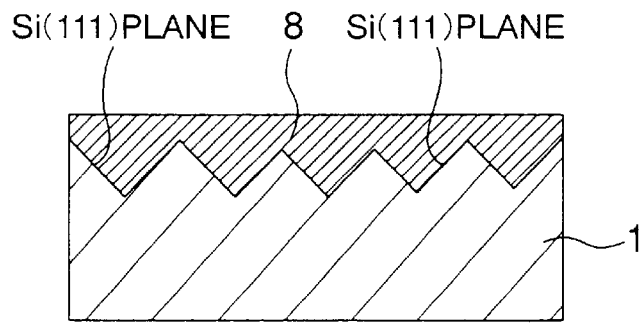
FIG. 11 is an illustration showing a characteristic feature in shape of the cobalt silicide film formed by the production process of the semiconductor device in the fifth embodiment of the present invention.

FIG. 10: Thereafter, other necessary steps are carried out to complete a semiconductor device. For instance, an insulating film 12 of the first layer is formed in contact with the whole surface of the silicon substrate including the cobalt silicide films 8, 9, 10, side walls 7 and isolation films 2, then contact holes 13, 14 are formed, followed by formation of electrical wirings 16, 17 of the first layer, and finally an insulating film 19 is formed to complete a semiconductor device.

The above-described step is but an exemplification and can be replaced by other embodiments. Also, the number of the wiring layers is not limited to one. In the present embodiment of the invention, there was shown the production process of a semiconductor device having the Ni-containing cobalt silicide films. For producing a semiconductor device having the Fe-containing cobalt silicide films, said Ni-containing cobalt film 20 is simply replaced by an Fe-containing cobalt film in the above-described process.

This semiconductor device can be adapted to DRAM (dynamic random access memory), SRAM (static random access memory), microcomputers, LSI systems and such.

The production process of a semiconductor device according to the sixth embodiment of the present invention is shown in FIGS. 12 through 15. An epitome of the production process according to this embodiment is described stepwise in accordance with the figures.

Figure 12:
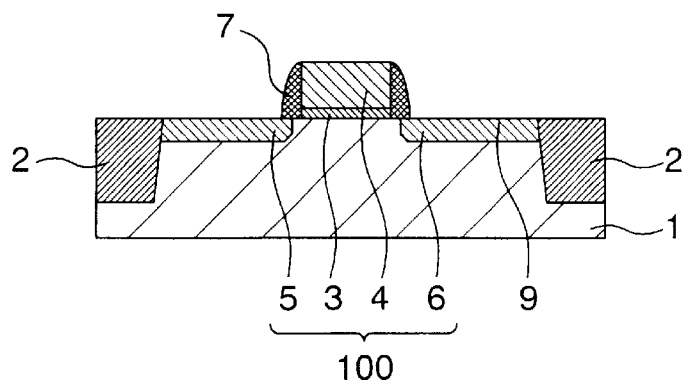
FIG. 12 is an illustration showing part of the production process of a semiconductor device in a sixth embodiment of the present invention.

FIG. 12: An active region and an isolation region are provided on the principal surface of a silicon substrate 1 by an isolation film 2. A gate oxide film 3 and a gate electrode 4 are formed in the active region of said silicon substrate 1. Then, side walls 7 are formed on both side of said gate electrode 4. Then, with said gate electrode 4, side walls 7 and isolation film 2 being masked, impurities are injected into said silicon substrate 1 to form diffusion layers 5, 6. This step is one which is commonly practiced in the production of ordinary MOS transistors, and has no direct bearing on the present invention. This step is therefore not limited to the above-described procedure but any ordinary transistor forming step can be employed.

Figure 13:
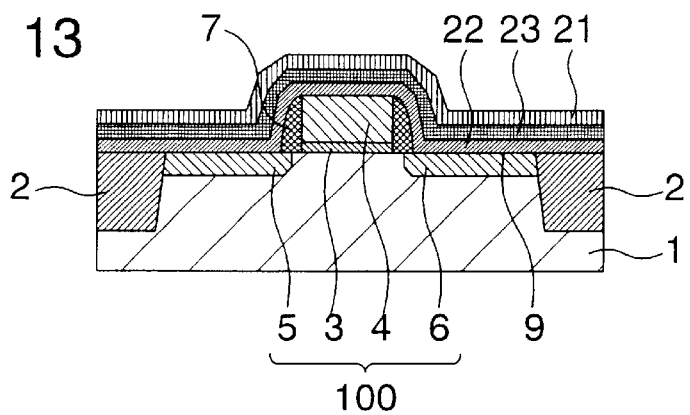
FIG. 13 is an illustration showing part of the production process of the semiconductor device in the sixth embodiment of the present invention.

FIG. 13: A cobalt film 22 is formed, as by sputtering, in contact with the upper side of at least said gate electrode 4 and diffusion layers 5, 6 on said silicon substrate 1. On this cobalt film 22 is formed a nickel film 23, on which a titanium nitride film 21 is further formed. The film formed on said nickel film 23 may not necessarily be a titanium nitride film; it may be other metal film or an insulating film, or may not be provided at all.

Figure 14:
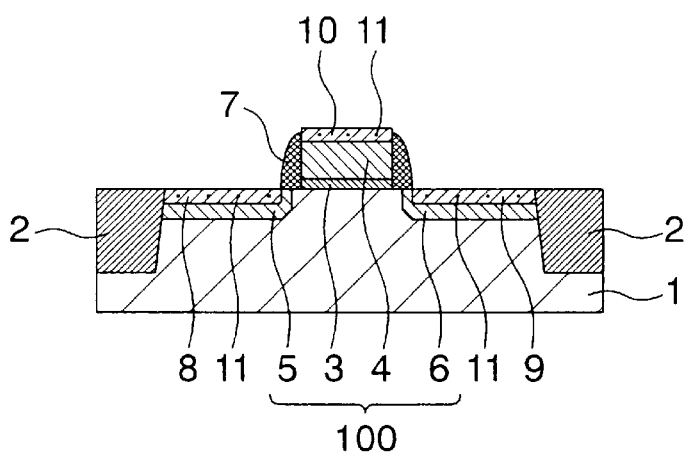
FIG. 14 is an illustration showing part of the production process of the semiconductor device in the sixth embodiment of the present invention.

FIG. 14: Thereafter, a treatment, for instance a 700° C. heat treatment is carried out to cause a silicide reaction of the silicon of said gate electrode 4 and diffusion layers 5, 6 with the cobalt film, thereby forming the cobalt silicide films 8, 9, 10 selectively on said gate electrode 4 and/or diffusion layers 5, 6. Here, Ni-containing cobalt silicide is formed by reacting silicon with the nickel-cobalt layered film. Since the grain boundary diffusion of Co atoms in the cobalt silicide film is inhibited, there takes place no coagulation in the ensuing step of high-temperature heat treatment, allowing formation of a low-resistance cobalt silicide.

The said unreacted Ni-containing cobalt film 22, nickel film 23 and titanium nitride film 21 on the isolation film 2 and side walls 7 are removed by wet etching or other means.

In the above-described embodiment, a cobalt silicide film is formed on both of the gate electrode and diffusion layers, but it may be formed on only one of them.

Also, the heat treatment for forming the cobalt silicide film may be carried out in two stages at about 500° C. and about 700° C., respectively. In this case, etching of the unreacted Ni-containing cobalt film and titanium nitride film may be conducted after 500° C. annealing.

FIG. 15: Thereafter, other necessary steps are carried out to complete a semiconductor device. For instance, an insulating film 12 of the first layer is formed in contact with the whole surface of the silicon substrate including the cobalt silicide films 8, 9, 10, side walls 7 and isolation film 2, then contact holes 13, 14 are formed, followed by formation of electrical wirings 16, 17 of the first layer, and finally an insulating film 19 is formed to complete a semiconductor device. The above-described step is but an exemplification and can be replaced by other embodiments. Also, the number of the wiring layers is not limited to one.

In this embodiment of the invention, a cobalt film 22 is formed in contact with the upper side of at least said gate electrode 4 and diffusion layers 5, 6 on said silicon substrate 1, then an nickel film is formed on said cobalt film 22, and then nickel silicide or Ni-containing cobalt silicide is formed by a heat treatment, but the order of lamination is of no account as far as a laminate of a cobalt film and a nickel film is provided.

For instance, a nickel film 23 is formed in contact with the upper side of at least said electrode 4 and diffusion layers 5, 6 on said silicon substrate 1, then a cobalt film 22 is formed on said nickel film 23, and then cobalt silicide is formed by a heat treatment. In this case, too, the same effect as described above can be obtained.

It is also possible to provide plural cobalt/nickel laminates. The same effect can be obtained in this case, too.

In this embodiment, a process for producing a semiconductor device having a cobalt silicide film containing Ni as adding element has been described. For producing a semiconductor device having a cobalt silicide film containing Fe as adding element, an Fe film is used in place of the Ni film in the above process.

Also, this semiconductor device can be used for DRAM (dynamic random access memory), SRAM (static random access memory), microcomputers, LSI systems, etc.

According to the present invention, it is possible to inhibit grain boundary diffusion of Co atoms in the cobalt silicide film by containing in said film an element which has a smaller atomic radius than Co atoms and which meets the requirement that the inter-atomic energy between this element and Co element is not more than 20% smaller or greater than the inter-atomic energy of Co atoms, that is, nickel or iron element.

Therefore, it is possible to inhibit the Co atoms composing the cobalt silicide film from being diffused along the crystal grain boundaries, and to thereby inhibit coagulation of the film, in the steps after formation of said film, even in case a high-temperature heat treatment is conducted. Thus, there is provided a semiconductor device having the cobalt silicide films which are low in resistance even if reduced in thickness.

What is claimed is:

1. A semiconductor device comprising:
   a silicon substrate;
   a silicon-made gate electrode formed on said silicon substrate;
   a diffusion layer(s) formed close to said gate electrode; and
   a cobalt silicide film formed on at least said gate electrode or said diffusion layer,
   wherein at least nickel or iron is contained in said cobalt silicide film in an amount of 0.05 to 50 atomic %.

2. A semiconductor device according to claim 1, wherein the ratio of nickel or iron to cobalt in the cobalt silicide film is 0.05 to 18 atomic %.

3. A semiconductor device comprising:
   a silicon substrate having MOS transistors formed thereon;
   an insulating film formed on said silicon substrate;
   contact holes formed in said insulating film;
   a polycrystalline silicon plug provided in each of said contact holes;
   metal wiring provided on said insulating film; and
   a cobalt silicide film formed at least at the interface between said metal wiring and said polycrystaline plug or at the interface between said metal wiring and said silicon substrate,
   wherein at least nickel or iron is contained in said cobalt silicide film in an amount of 0.05 to 50 atomic %.

4. A semiconductor device comprising:
   a silicon substrate having MOS transistors formed thereon;
   an insulating film formed on said silicon substrate;
   contact holes formed in said insulating film;
   a polycrystalline silicon plug provided in each of said contact holes;
   metal wiring provided on said insulating film; and
   a cobalt silicide film formed at least at the interface between said metal wiring and said polycrystalline plug, at the interface between said metal wiring and said silicon substrate or at the interface between said metal wiring and the gate electrode of each of said MOS transistors,
   wherein at least nickel or iron is contained in said cobalt silicide film in an amount of 0.05 to 50 atomic %.

5. A semiconductor device comprising:
   a silicon substrate having MOS transistors formed thereon;
   an insulating film formed on said silicon substrate;
   a capacitor provided on said insulating film; and
   a cobalt silicide film formed at least on the gate electrode of each of said MOS transistors,
   wherein at least nickel or iron is contained in said cobalt silicide film in an amount of 0.05 to 50 atomic %.

6. A process for producing a semiconductor device comprising the steps of:
   forming a gate electrode on a silicon substrate;

forming a diffusion layer(s) on said silicon substrate;

forming a cobalt film in contact with the upper side of at least said gate electrode or said diffusion layer(s);

depositing at least a nickel film or an iron film on said cobalt film; and forming a cobalt silicide film containing at least nickel or iron in an amount of 0.05 to 50 atomic % on at least said gate electrode or said diffusion layer(s).

7. A process for producing a semiconductor device comprising the steps of:

forming a gate electrode on a silicon substrate;

forming a diffusion layer(s) on said silicon substrate;

depositing a cobalt film containing at least nickel or iron on at least said gate electrode or diffusion layer(s); and forming a cobalt suicide film containing at least nickel or iron in an amount of 0.05 to 50 atomic % on at least said gate electrode or said diffusion layer(s).

8. The process according to claim 7, wherein said cobalt film containing at least nickel or iron is deposited by multi-stage sputtering.

9. The process according to claim 7, wherein said cobalt film containing at least nickel or iron is deposited by sputtering using a cobalt target containing at least nickel or iron.

10. A process for producing a semiconductor device comprising the steps of:

forming an insulating film on a silicon substrate having MOS transistors formed thereon;

providing contact holes in said insulating film;

forming a cobalt film in each of said contact holes;

forming at least a nickel film or an iron film on said cobalt film; and forming a cobalt silicide film in each of said contact holes by a heat treatment.

11. A process for producing a semiconductor device comprising the steps of:

forming an insulating film on a silicon substrate having MOS transistors formed thereon;

providing contact holes in said insulating film;

forming a polycrystalline silicon plug in each of said contact holes;

forming a cobalt film on said polycrystalline silicon plug in each of said contact holes;

forming at least a nickel film or an iron film on said cobalt film; and forming a cobalt silicide film containing at least nickel or iron in an amount of 0.05 to 50 atomic % in each of said contacts hole by a heat treatment.

12. A process for producing a semiconductor device comprising the steps of:

forming an insulating film on a silicon substrate having MOS transistors formed thereon;

providing contact holes in said insulating film;

forming a cobalt film containing at least nickel or iron in each of said contact holes; and forming a cobalt silicide film in each of said contacts hole by a heat treatment.

13. A process for producing a semiconductor device comprising the steps of:

forming an insulating film on a silicon substrate having MOS transistors formed thereon;

providing contact holes in said insulating film;

forming a polycrystalline silicon plug in each of said contact holes;

forming a cobalt film containing at least nickel or iron on said polycrystalline silicon plug in each of said contact holes; and forming a cobalt silicide film containing at least nickel or iron in an amount of 0.05 to 50 atomic % in each of said contact holes by a heat treatment.

* * * * *